United States Patent
Kadono

(10) Patent No.: US 9,224,601 B2
(45) Date of Patent: *Dec. 29, 2015

(54) METHOD OF PRODUCING EPITAXIAL SILICON WAFER, EPITAXIAL SILICON WAFER, AND METHOD OF PRODUCING SOLID-STATE IMAGE SENSING DEVICE

(71) Applicant: SUMCO Corporation, Minato-ku, Tokyo (JP)

(72) Inventor: Takeshi Kadono, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/078,217

(22) Filed: Nov. 12, 2013

(65) Prior Publication Data

US 2014/0134779 A1 May 15, 2014

(30) Foreign Application Priority Data

Nov. 13, 2012 (JP) ................................. 2012-249221

(51) Int. Cl.
*H01L 21/02* (2006.01)
*H01L 27/146* (2006.01)
*H01L 21/265* (2006.01)
*H01L 21/322* (2006.01)

(52) U.S. Cl.
CPC ...... *H01L 21/02658* (2013.01); *H01L 21/0262* (2013.01); *H01L 21/02381* (2013.01); *H01L 21/02532* (2013.01); *H01L 21/02576* (2013.01); *H01L 21/02631* (2013.01); *H01L 21/26566* (2013.01); *H01L 21/3225* (2013.01); *H01L 27/14687* (2013.01)

(58) Field of Classification Search
None
See application file for complete search history.

(56) References Cited

U.S. PATENT DOCUMENTS

| 5,416,345 | A | * | 5/1995 | Matsunaga | 257/222 |
| 5,734,195 | A | * | 3/1998 | Takizawa et al. | 257/607 |
| 7,259,036 | B2 | * | 8/2007 | Borland et al. | 438/37 |
| 7,563,379 | B2 | * | 7/2009 | Suzuki et al. | 216/2 |
| 2010/0290971 | A1 | * | 11/2010 | Itou et al. | 423/348 |

FOREIGN PATENT DOCUMENTS

| JP | 6-338507 A | 12/1994 |
| JP | 11-147786 A | 6/1999 |
| JP | 2008-294245 A | 12/2008 |
| JP | 2010-177233 A | 8/2010 |

OTHER PUBLICATIONS

Co-pending U.S. Appl. No. 14/078,286, to Takeshi Kodono, filed Nov. 12, 2013.*
Office Action mailed Mar. 25, 2015, issued in corresponding Taiwanese Patent Application No. 102141074, filed Nov. 11, 2013, 11 pages.

* cited by examiner

*Primary Examiner* — Scott B Geyer
(74) *Attorney, Agent, or Firm* — Christensen O'Connor Johnson Kindness PLLC

(57) ABSTRACT

Provided is an epitaxial silicon wafer free of epitaxial defects caused by dislocation clusters and COPs with reduced metal contamination achieved by higher gettering capability and a method of producing the epitaxial wafer. A method of producing an epitaxial silicon wafer includes a first step of irradiating a silicon wafer free of dislocation clusters and COPs with cluster ions to form a modifying layer formed from a constituent element of the cluster ions in a surface portion of the silicon wafer; and a second step of forming an epitaxial layer on the modifying layer of the silicon wafer.

9 Claims, 7 Drawing Sheets

METHOD OF PRODUCING EPITAXIAL SILICON WAFER, EPITAXIAL SILICON WAFER, AND METHOD OF PRODUCING SOLID-STATE IMAGE SENSING DEVICE

TECHNICAL FIELD

The present invention relates to a method of producing an epitaxial silicon wafer, an epitaxial silicon wafer, and a method of producing a solid-state image sensing device. The present invention relates in particular to a method of producing an epitaxial silicon wafer free of epitaxial defects caused by dislocation clusters and crystal originated particles (COPs), which method can achieve higher gettering capability thereby suppressing metal contamination.

BACKGROUND ART

Metal contamination is a major cause of deterioration in characteristics of a semiconductor device. For example, for a back-illuminated solid-state image sensing device, metal mixed into a semiconductor epitaxial wafer to be a substrate of the device causes increased dark current in the solid-state image sensing device, and results in formation of defects referred to as white spot defects. Recently, a back-illuminated image sensing device has been widely used for digital cameras and mobile phones such as smartphones because it can directly receive light from the outside, and take sharper images or motion pictures even in a dark place and the like due to the fact that a wiring layer and the like thereof are disposed at a lower layer than a sensor unit. Therefore, it is desirable to reduce white spot defects as much as possible.

Mixing of metal into a wafer mainly occurs in a process of producing a semiconductor epitaxial wafer and a process of producing a solid-state image sensing device (device fabrication process). Metal contamination in the former process of producing a semiconductor epitaxial wafer may be due to heavy metal particles from components of an epitaxial growth furnace, or heavy metal particles caused by metal corrosion of piping materials of the furnace due to chlorine-based gas used in epitaxial growth in the furnace. In recent years, such metal contaminations have been reduced to some extent by replacing components of epitaxial growth furnaces with highly corrosion resistant materials, but not to a sufficient extent. On the other hand, in the latter process of producing a solid-state image sensing device, heavy metal contamination of semiconductor substrates would occur in process steps such as ion implantation, diffusion, and oxidizing heat treatment in the producing process.

For these reasons, conventionally, heavy metal contamination of semiconductor epitaxial wafers has been avoided by forming, in the semiconductor wafer, a gettering sink for trapping the metal, or using a substrate, such as a high boron concentration substrate, having high ability to trap the metal (gettering capability).

In general, a gettering sink is formed in a semiconductor wafer by an intrinsic gettering (IG) method in which oxygen precipitates (commonly called a silicon oxide precipitate, and also called BMD: bulk micro defect) or dislocations that are crystal defects are formed within the semiconductor wafer, or an extrinsic gettering (EG) method in which the gettering sink is formed on the rear surface of the semiconductor wafer.

Here, a technique of forming gettering sites in a semiconductor wafer by ion implantation can be given as a technique for gettering heavy metal. JP 06-338507 A (PTL 1) discloses a producing method, by which carbon ions are implanted through a surface of a silicon wafer to form a carbon ion implanted region, and a silicon epitaxial layer is formed on its surface thereby obtaining a silicon epitaxial wafer. In that technique, the carbon ion implanted region functions as gettering sites.

Further, JP 2008-294245 A (PTL 2) discloses a method of forming a carbon implanted layer by implanting carbon ions into a silicon wafer, and then performing heat treatment using a rapid thermal annealing (RTA) apparatus for recovering the crystallinity of the wafer which has been disrupted by the ion implantation, thereby shortening the recovery heat treatment process.

Further, JP 2010-177233 A (PTL 3) discloses a method of producing an epitaxial wafer, comprising the steps of ion-implanting at least one of boron, carbon, aluminum, arsenic, and antimony at a dose in the range of $5 \times 10^{14}$ atoms/cm$^2$ to $1 \times 10^{16}$ atoms/cm$^2$ into a single crystal silicon ingot substrate; then cleaning the single crystal silicon ingot substrate subjected to the ion implantation, without recovery heat treatment; and then forming an epitaxial layer at a temperature of 1100° C. or more using a single wafer processing epitaxial apparatus.

In addition to such formation of a gettering sink, it is important to ensure high quality of a substrate per se of a semiconductor epitaxial wafer. In this respect, JP 11-147786 A (PTL 4) discloses a technique of producing a silicon single crystal wafer having extremely low defect density over the entire surface of the crystal by Czochralski process (CZ method).

CITATION LIST

Patent Literature

PTL 1: JP 06-338507 A
PTL 2: JP 2008-294245 A
PTL 3: JP 2010-177233 A
PTL 4: JP 11-147786 A

SUMMARY OF INVENTION

Technical Problem

In the techniques described in PTL 1, PTL 2, and PTL 3, monomer ions (single ions) are implanted into a silicon wafer before forming an epitaxial layer. However, according to studies made by the inventor of the present invention, it was found that white spot defects cannot be sufficiently reduced in solid-state image sensing devices produced using silicon epitaxial wafers subjected to monomer-ion implantation, and such epitaxial silicon wafers are required to achieve stronger gettering capability.

Further, in terms of producing a high quality semiconductor device, it is important that no defects are found in an epitaxial layer of an epitaxial silicon wafer to be a substrate. When dislocation clusters or COPs are formed in a surface layer part of a silicon wafer to be a substrate of an epitaxial silicon wafer, epitaxial defects such as stacking faults would occur due to them.

In view of the above problems, an object of the present invention is to provide an epitaxial silicon wafer free of epitaxial defects caused by dislocation clusters and COPs with reduced metal contamination achieved by higher gettering capability and a method of producing the epitaxial wafer.

Solution to Problem

According to further studies made by the inventor of the present invention, irradiation of a silicon wafer with cluster ions is advantageous in the following points as compared with implantation of monomer ions into the silicon wafer. Specifically, even if irradiation with cluster ions is performed at an acceleration voltage equivalent to the case of monomer ion implantation, the energy per one atom or one molecule applied to the irradiated silicon wafer is advantageously lower than in the case of monomer ion implantation, and irradiation with a plurality of atoms can be performed at a time. This results in higher peak concentration in the depth direction profile of the irradiating element, and allows the peak position to approach the surface of the silicon wafer. Thus, the gettering capability was found to be improved. It was also found that use of a silicon wafer free of dislocation clusters and COPs as the substrate of an epitaxial wafer allows for obtaining an epitaxial silicon wafer free of epitaxial defects caused by dislocation clusters and COPs. Thus, the present invention was completed.

Specifically, a method of producing an epitaxial silicon wafer of the present invention includes a first step of irradiating a silicon wafer free of dislocation clusters and COPs with cluster ions to form a modifying layer formed from a constituent element of the cluster ions in a surface portion of the silicon wafer; and a second step of forming an epitaxial silicon layer on the modifying layer of the silicon wafer.

Here, the cluster ions preferably contain carbon as a constituent element, and more preferably contain at least two kinds of elements including carbon as constituent elements.

In the present invention, after the first step, the silicon wafer can be transferred into an epitaxial growth apparatus to be subjected to the second step without heat treating the silicon wafer for recovering its crystallinity.

Further, in the first step, the silicon wafer can be irradiated with the cluster ions such that the peak of a concentration profile of the constituent element in the depth direction of the modifying layer lies at a depth within 150 nm from the surface of the silicon wafer.

Moreover, the first step is preferably performed under the conditions of acceleration voltage per one carbon atom: 50 keV/atom or less, cluster size: 100 or less, and carbon dose: $1 \times 10^{16}$ atoms/cm$^2$ or less. Further, the first step is more preferably performed under the conditions of: acceleration voltage per one carbon atom: 40 keV/atom or less, cluster size: 60 or less, and carbon dose: $5 \times 10^{15}$ atoms/cm$^2$ or less.

A semiconductor epitaxial wafer of the present invention includes a silicon wafer free of dislocation clusters and COPs; a modifying layer formed from a certain element in a surface portion of the silicon wafer; and an epitaxial layer on the modifying layer. The half width of a concentration profile of the certain element in the depth direction of the modifying layer is 100 nm or less.

Further, the peak of the concentration profile in the modifying layer preferably lies at a depth within 150 nm from the surface of the silicon wafer. The peak concentration of the concentration profile of the modifying layer is preferably $1 \times 10^{15}$ atoms/cm$^3$ or more.

Here, the certain element preferably includes carbon. More preferably, the certain element includes at least two kinds of elements including carbon.

For a method of producing a solid-state image sensing device according to the present invention, a solid-state image sensing device is formed on the epitaxial layer, located in the surface portion of the epitaxial wafer fabricated by the above producing method or the above epitaxial silicon wafer.

Advantageous Effect of Invention

According to the method of producing an epitaxial silicon wafer of the present invention, a silicon wafer free of dislocation clusters and COPs is irradiated with cluster ions to form a modifying layer made of a constituent element of the cluster ions in a surface portion of the silicon wafer, thereby producing an epitaxial silicon wafer free of epitaxial defects caused by dislocation clusters and COPs with reduced metal contamination achieved by higher gettering capability of the modifying layer.

DESCRIPTION OF EMBODIMENTS

Figure 1:
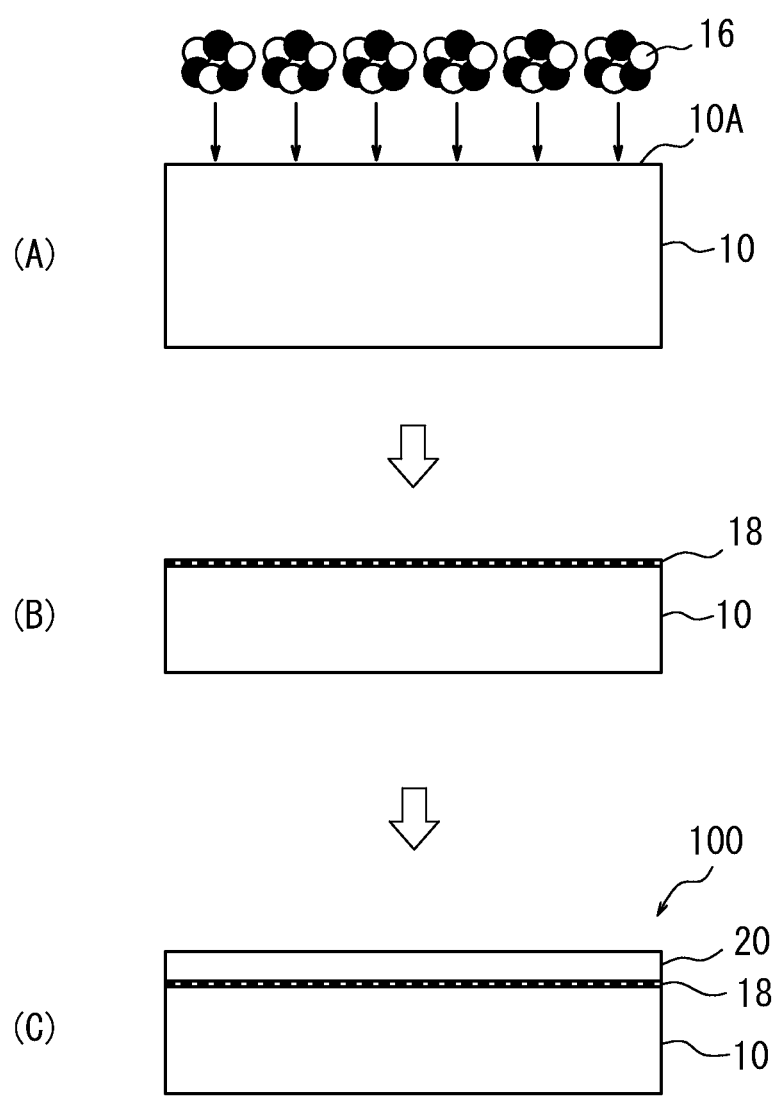
FIGS. 1A to 1C are schematic cross-sectional views illustrating a method of producing an epitaxial silicon wafer 100 of the present invention.

Embodiments of the present invention will be described below in detail with reference to the drawings. In principle, the same components are denoted by the same reference numeral, and the description will not be repeated. In FIG. 1C, an epitaxial layer 20 is exaggerated with respect to a silicon wafer 10 in thickness for the sake of explanation, so the thickness ratio does not conform to the actual ratio.

As shown in FIGS. 1A to 1C, a method of producing an epitaxial silicon wafer 100 according to the present invention includes a first step of irradiating a silicon wafer 10 with cluster ions 16 to form a modifying layer 18 formed from a constituent element of the cluster ions 16 in a surface portion 10A of the silicon wafer 10 (FIGS. 1A and 1B); and a second step of forming an epitaxial layer 20 on the modifying layer 18 of the silicon wafer 10 (FIG. 1C). FIG. 1C is a schematic cross-sectional view of the epitaxial silicon wafer 100 obtained by the production method.

First, a silicon wafer free of dislocation clusters and COPs is used as the silicon wafer 10 in the present invention. One of the typical examples of a method of producing a single crystal silicon ingot that is a material of the silicon wafer 10 is the Czochralski process. In producing a single crystal silicon ingot using the Czochralski process, a single crystalline silicon melt is supplied into a quartz crucible, the seed crystal is pulled upward while rotating the quartz crucible and the seed crystal, and thus a single crystal silicon ingot is grown downward from the seed crystal.

It is known that various types of grown-in defects occur in thus grown single crystal silicon ingots, which defects affect the device fabrication process. Typical examples of the grown-in defects include dislocation clusters that are formed in a region where interstitial silicon is predominant due to the growth under the condition of low pulling speed (hereinafter also referred to as "I region") and COPs that are formed in a region where vacancies are predominant due to the growth under the condition of high pulling speed (hereinafter referred to as "V region"). Further, in the vicinity of the interface between the I region and the V region, defects are formed in a ring shape, which defects are called oxidation induced stacking faults (OSF).

Figure 2:
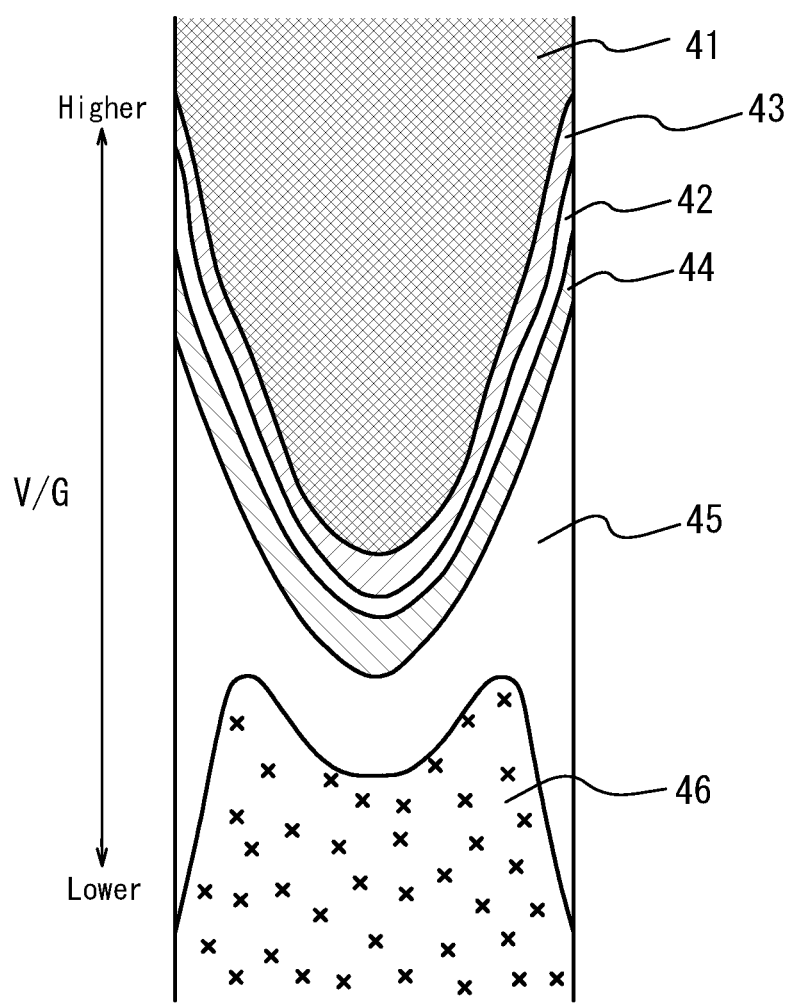
FIG. 2 is a diagram showing the relationship between the ratio of the pulling speed to the temperature gradient at the solid-liquid interface and crystalline regions forming a single crystal silicon ingot.

The distribution of these defects in a grown single crystal silicon ingot is known to depend on two factors, that is, the crystal pulling speed V and the temperature gradient G at the solid-liquid interface. FIG. 2 is a diagram showing the relationship between the ratio of the pulling speed V to the temperature gradient G at the solid-liquid interface (V/G) and crystalline regions forming a single crystal silicon ingot. As shown in the diagram, in the single crystal silicon ingot, a COP formation region 41 which is a crystalline region where COPs are detected is predominant when the V/G is high, whereas an OSF latent nucleus region 42 which appears as a ring-shaped OSF region when performing a certain oxidation heat treatment is formed when the V/G is low. COPs are not detected in this OSF region 42. Further, the silicon wafer collected from the single crystal silicon ingot grown under a condition of high pulling speed, the COP formation region 41 mostly occupies the wafer, so that COPs are formed in almost the entire area in the crystal diameter direction.

Further, an oxygen precipitation promoted region (hereinafter also referred to as "Pv(1) region") 43, which is a crystalline region where oxygen is likely to precipitate and COPs are not detected, is formed inside the OSF latent nucleus region 42.

With the V/G being lowered, an oxygen precipitation promoted region (hereinafter also referred to as "Pv(2) region") 44, which is a crystalline region where oxygen precipitates are present and COPs are not detected, is formed outside the OSF latent nucleus region 42.

With the V/G being further lowered, an oxygen precipitation inhibited region (hereinafter also referred to as "Pi region") 45, which is a crystalline region where oxygen is unlikely to precipitate and COPs are not detected is formed, and a region 46, which is a crystalline region where dislocation clusters are detected, is formed.

For a silicon wafer collected from a single crystal silicon ingot having such a distribution of defects depending on the pulling speed, the crystalline region other than the COP formation region 41 and the dislocation cluster region 46 is a crystalline region generally regarded as a denuded zone having no defects. The silicon wafer collected from a single crystal silicon ingot including these crystalline regions is a silicon wafer free of dislocation clusters and COPs. Accordingly, in the present invention, a silicon wafer collected from a single crystal silicon ingot made of any one of the crystalline regions other than the COP formation region 41 and the dislocation cluster region 46, namely, the OSF latent nucleus region 42, the Pv(1) region 43, the Pv(2) region 44, and the oxygen precipitation inhibited region (Pi region) 45, or a combination of them, is used as the substrate of an epitaxial silicon wafer (namely, silicon wafer 10).

Here, a "silicon wafer free of COPs" in the present invention refers to a silicon wafer having no COPs detected by the observation and evaluation described below. Specifically, first, a silicon wafer cut out of a single crystal silicon ingot grown by the Czochralski process is subjected to SC-1 cleaning (that is, a cleaning using a mixed solution obtained by mixing ammonium hydroxide, a hydrogen peroxide solution, and ultrapure water at a ratio of 1:1:15), and after the cleaning the surface of the silicon wafer is observed and evaluated using Surfscan SP2 manufactured by KLA-Tencor Corporation as a surface defect inspection apparatus, thereby identifying light point defects (LPDs) estimated as surface pits. On this occasion, the observation mode is oblique mode (oblique incidence mode), and the surface pits are examined based on the ratio of the sizes measured using wide/narrow channels. Whether the thus identified LPDs are COPs or not is evaluated using an atomic force microscope (AFM). A silicon wafer in which no COPs are observed by this observation and evaluation is referred to as a "COP free silicon wafer".

Note that since the detection limit size reported by the manufacturer of the SP2 is 37 nm, the COP free silicon wafer does not negate the presence of COPs smaller than the detection limit size. As is evident from examples described below, epitaxial defects were not observed in epitaxial silicon wafers produced using a silicon wafer in which no COPs were detected by the above observation and evaluation. Accordingly, in terms of preventing the formation of epitaxial defects, if COPs are not detected by SP2 and AFM, it is safe to consider that they do not substantially exist. Therefore, a silicon wafer specified by the above definition is herein referred to as a "COP free silicon wafer".

Meanwhile, dislocation clusters are defects (dislocation loops) having a large size (about 10 µm) formed as aggregates of excessive interstitial silicon. Whether the dislocation clusters exist or not can be easily confirmed even by visual observation by performing etching such as Secco etching, or Cu decoration to visualize them. When a silicon wafer including dislocation clusters is employed, a large amount of defects (such as stacking faults) induced by the dislocation clusters would occur; therefore, such a silicon wafer cannot be used as a substrate of an epitaxial silicon wafer.

When the above single crystal silicon ingot is grown, if the oxygen concentration is too high, epitaxial defects are easily formed by oxygen precipitates. Further, in the case of using a wafer collected from a crystalline region including the OSF latent nucleus region 42, epitaxial defects (stacking fault) may be formed in the epitaxial layer formed on the wafer. In order to reduce such defects, the oxygen concentration is effectively lowered, specifically, it is preferable to lower the oxygen concentration to $16 \times 10^{17}$ atoms/cm$^3$ or less (ASTM F121-1979). In terms of ensuring the strength of the wafer, the oxygen concentration is preferably $6 \times 10^{17}$ atoms/cm$^3$ or more.

The polarity of the thus prepared silicon wafer 10 may be n-type or p-type. In addition to the irradiation with cluster ions described below, a silicon wafer having a crystal into which carbon and/or nitrogen are added may be used to further increase gettering capability.

Next, the technical meaning of employing the step of cluster ion irradiation, which is a characteristic step of the present invention, will be described with its operation and effect. The modifying layer 18 formed as a result of irradiation with the cluster ions 16 is a region where the constituent element of the cluster ions 16 is localized at crystal interstitial positions or substitution positions in the crystal lattice of the surface portion 10A of the silicon wafer 10, which region functions as a gettering site. The reason may be as follows. After irradiation in the form of cluster ions, elements such as carbon and boron are localized at high density at substitution positions and interstitial positions in the single crystal silicon. It has been experimentally found that when carbon or boron is turned into a solid solution to the equilibrium concentration of single crystal silicon or higher, the solid solubility of heavy metals (saturation solubility of transition metal) extremely increases. It is considered that carbon or boron made into a solid solution to the equilibrium concentration or higher increases the solubility of heavy metals, which results in significantly increased rate of trapping the heavy metals.

Here, since irradiation with the cluster ions 16 is performed in the present invention, higher gettering capability can be achieved as compared to cases of implanting monomer ions. Moreover, recovery heat treatment can be omitted. Therefore, the epitaxial silicon wafer 100 achieving higher gettering capability can be more efficiently produced, and white spot defects are expected to be reduced more than conventional in back-illuminated solid-state image sensing devices produced from the epitaxial silicon wafer 100 obtained by the producing methods.

Further, as described above, a silicon wafer free of dislocation clusters and COPs is used as the silicon wafer 10 in the present invention. However, this wafer may have one or more of the OSF latent nucleus region 42, the Pv(1) region 43, the Pv(2) region 44, and the Pi region 45. In that case, the oxygen precipitate density in the wafer diameter direction is not uniform in the wafer surface portion, so that the gettering capability varies in the diameter direction. However, since the modifying layer 18 formed by irradiation with cluster ions have high gettering capability, the gettering capability in the vicinity of the wafer surface can be uniform in the wafer surface portion. Note that "cluster ions" herein mean clusters formed by aggregation of a plurality of atoms or molecules, which are ionized by being positively or negatively charged. A cluster is a bulk aggregate having a plurality (typically about 2 to 2000) of atoms or molecules bound together.

The inventor of the present invention considers the operation achieving such an effect as follows.

Figure 3:
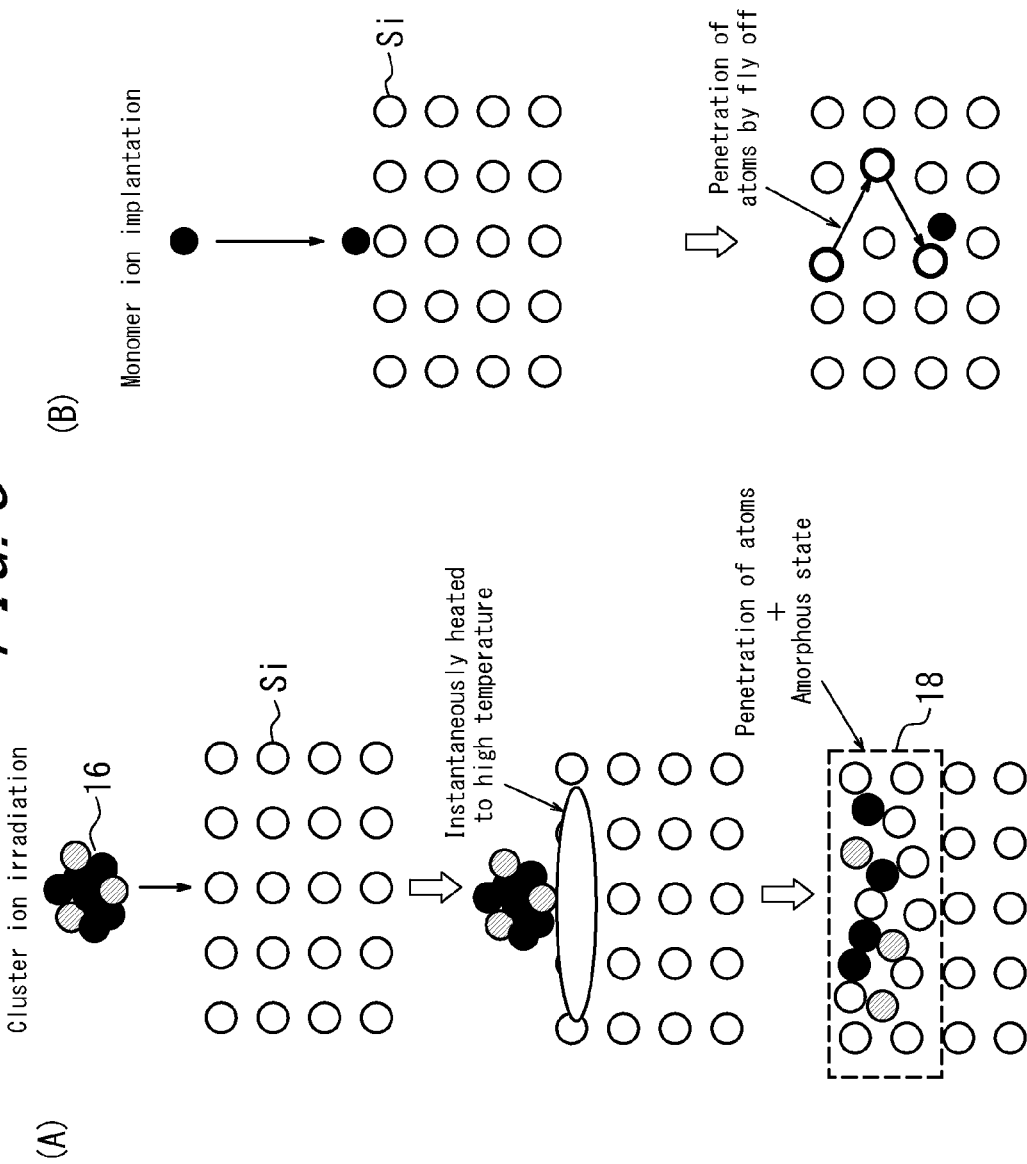
FIG. 3A is a schematic view illustrating an irradiation mechanism of the irradiation with cluster ions.
FIG. 3B is a schematic view illustrating an implantation mechanism of the implantation of monomer ions.

For example, when carbon monomer ions are implanted into a silicon wafer, the monomer ions sputter silicon atoms forming the silicon wafer to be implanted to a predetermined depth position in the silicon wafer, as shown in FIG. 3B. The implantation depth depends on the kind of the constituent element of the implantation ions and the acceleration voltage of the ions. In this case, the concentration profile of carbon in the depth direction of the silicon wafer is relatively broad, and the carbon implanted region extends approximately 0.5 mm to 1 mm. When a plurality of species of ions are simultaneously implanted at the same energy, lighter elements are implanted more deeply, in other words, elements are implanted at different positions depending on their masses. Accordingly, the concentration profile of the implanted elements is broader in such a case.

Monomer ions are typically implanted at an acceleration voltage of about 150 keV to 2000 keV. However, the ions collide with silicon atoms with the energy, which results in disrupted crystallinity of the surface portion of the silicon wafer, to which the monomer ions are implanted. Accordingly, the crystallinity of an epitaxial layer to be grown later on the wafer surface is disrupted. Further, the higher the acceleration voltage is, the more the crystallinity is disrupted. Therefore, it is required to perform heat treatment for recovering the crystallinity having been disrupted at a high temperature for a long time after ion implantation (recovery heat treatment).

On the other hand, when cluster ions formed from, for example, a silicon wafer is irradiated with carbon and boron as shown in FIG. 3A, the cluster ions 16 are instantaneously turned into a high temperature state of about 1350° C. to 1400° C. due to the irradiated energy, thus melting silicon. After that, the silicon is rapidly cooled to form solid solutions of carbon and boron in the vicinity of the surface of the silicon wafer. Accordingly, a "modifying layer" herein means a layer in which the constituent element of the ions used for irradiation forms a solid solution at crystal interstitial positions or substitution positions in the crystal lattice of the surface portion of the silicon wafer. The concentration profile of carbon and boron in the depth direction of the silicon wafer is sharper as compared with the case of monomer ions, although depending on the acceleration voltage and the cluster size of the cluster ions. The thickness of the region locally irradiated with carbon and boron (that is, the modification layer) is about 500 nm or less (for example, about 50 nm to 400 nm). After irradiation in the form of cluster ions, the elements are thermally diffused to some extent in the process of forming the epitaxial layer 20. Accordingly, in the concentration profile of carbon and boron after the formation of the epitaxial layer 20, broad diffusion regions are provided on both sides of the peak where these elements are localized. However, the thickness of the modifying layer does not vary greatly (see FIG. 7A described below). Consequently, carbon and boron are precipitated at a high concentration in a localized region. Since the modifying layer 18 is formed in the vicinity of the surface of the silicon wafer, further proximity gettering can be performed. This is considered to result in achievement of still higher gettering capability. The irradiation can be performed simultaneously with a plurality of species of ions in the form of cluster ions In general, irradiation with cluster ions is performed at an acceleration voltage of about 10 keV/Cluster to 100 keV/Cluster. However, since a cluster is an aggregate of a plurality of atoms or molecules, the irradiation with the ions can be performed at reduced energy per one atom or one molecule, which reduces damage to the crystals in the silicon wafer. Further, cluster ion irradiation does not disrupt the crystallinity of a silicon wafer as compared with monomer-ion implantation also due to the above described implantation mechanism. Accordingly, after the first step, without performing recovery heat treatment on the silicon wafer 10, the silicon wafer 10 can be transferred into an epitaxial growth apparatus to be subjected to the second step.

The cluster ions 16 may include a variety of clusters depending on the binding mode, and can be generated, for example, by known methods described in the following documents. Methods of generating gas cluster beam are described in (1) JP 09-041138 A and (2) JP 04-354865 A. Methods of generating ion beam are described in (1) Junzo Ishikawa, "Charged particle beam engineering", ISBN 978-4-339-00734-3 CORONA PUBLISHING, (2) The Institution of Electrical Engineers of Japan, "Electron/Ion Beam Engineering", Ohmsha, ISBN 4-88686-217-9, and (3) "Cluster Ion Beam—Basic and Applications", THE NIKKAN KOGYO SHIMBUN, ISBN 4-526-05765-7. In general, a Nielsen ion source or a Kaufman ion source is used for generating positively charged cluster ions, whereas a high current negative ion source using volume production is used for generating negatively charged cluster ions.

The conditions for irradiation with cluster ions will be described below. First, examples of the element used for irradiation include, but not limited to, carbon, boron, phosphorus, and arsenic. In terms of achieving higher gettering capability, the cluster ions preferably contain carbon as a constituent element. Carbon atoms at a lattice site have a smaller covalent radius than a single crystal silicon ingot, so that a compression site is produced in the silicon crystal lattice, which results in high gettering capability for attracting impurities in the lattice.

Further, the cluster ions preferably contain at least two kinds of elements including carbon as constituent elements. Since the kinds of metals to be efficiently gettered depend on the kinds of the precipitated elements, solid solutions of two or more kinds of elements can cover a wider variety of metal contaminations. For example, carbon can efficiently getter nickel, whereas boron can efficiently getter copper and iron.

The compounds to be ionized are not limited in particular, but examples of compounds to be suitably ionized include ethane, methane, propane, dibenzyl ($C_{14}H_{14}$), and carbon dioxide ($CO_2$) as carbon sources, and diborane and decaborane ($B_{10}H_{14}$) as boron sources. For example, when a mixed gas of dibenzyl and decaborane is used as a material gas, a hydrogen compound cluster in which carbon, boron, and hydrogen are aggregated can be produced. Alternatively, when cyclohexane ($C_6H_{12}$) is used as a material gas, cluster ions formed from carbon and hydrogen can be produced. Further, as a carbon source compound, clusters $C_nH_m$ ($3 \leq n \leq 16$, $3 \leq m \leq 10$) generated from pyrene ($C_{16}H_{10}$), dibenzyl ($C_{14}H_{14}$), or the like is preferably used in particular. This facilitates the formation of beams of small-sized cluster ions having a small diameter.

Next, the acceleration voltage and the cluster size of the cluster ions are controlled, thereby controlling the peak position of the concentration profile of the constituent elements in the depth direction of the modifying layer 18. "Cluster size" herein means the number of atoms or molecules constituting one cluster.

In the first step of the present invention, in terms of achieving higher gettering capability, the irradiation with the cluster ions 16 is preferably performed such that the peak of the concentration profile of the constituent elements in the depth direction of the modifying layer 18 lies at a depth within 150 nm from the surface portion 10A of the silicon wafer 10. Note that herein "the concentration profile of the constituent elements in the depth direction" in the case where the constituent elements include at least two kinds of elements, means the profiles with respect to the respective single element but not with respect to the total thereof.

For a condition required to set the peak positions to the depth level, when $C_nH_m$ ($3 \leq n \leq 16$, $3 \leq m \leq 10$) is used for the cluster ions 16, the acceleration voltage per one carbon atom is higher than 0 keV/atom and 50 keV/atom or lower, preferably 40 keV/atom or lower. Further, the cluster size is 2 to 100, preferably 60 or less, more preferably 50 or less.

In addition, for adjusting the acceleration voltage, two methods of (1) electrostatic field acceleration and (2) oscillating field acceleration are commonly used. The former method includes a method in which a plurality of electrodes are arranged at regular intervals, and the same voltage is applied therebetween, thereby forming constant acceleration fields in the direction of the axes. The latter method includes a linear acceleration (linac) method in which ions are transferred along a straight line and accelerated with high-frequency waves. The cluster size can be adjusted by controlling the pressure of gas ejected from a nozzle, the pressure of vacuum vessel, the voltage applied to the filament in the ionization, and the like. The cluster size is determined by finding the cluster number distribution by mass spectrometry using the oscillating quadrupole field or by time-of-flight mass spectrometry, and finding the mean value of the cluster numbers.

The cluster dose can be adjusted by controlling the ion irradiation time. In the present invention, the dose of carbon is $1 \times 10^{13}$ atoms/cm$^2$ or more and $1 \times 10^{16}$ atoms/cm$^2$ or less. A dose of less than $1 \times 10^{13}$ atoms/cm$^2$ would lead to insufficient gettering capability, whereas a dose exceeding $1 \times 10^{16}$ atoms/cm$^2$ would cause great damage to the epitaxial surface. The cluster dose is preferably $1 \times 10^{14}$ atoms/cm$^2$ or more and $5 \times 10^{15}$ atoms/cm$^2$ or less.

According to the present invention, as described above, it is not required to perform recovery heat treatment using a rapid heating/cooling apparatus or the like separate from the epitaxial apparatus, such as an RTA or an RTO. This is because the crystallinity of the silicon wafer 10 can be sufficiently recovered by hydrogen baking performed prior to epitaxial growth in an epitaxial apparatus for forming the epitaxial layer 20 to be described below. For typical conditions for hydrogen baking, the epitaxial growth apparatus has a hydrogen atmosphere inside and the silicon wafer 10 is introduced into the furnace at a furnace temperature of 600° C. to 900° C. and it is heated to a temperature in the range of about 1100° C. to 1200° C. at a rate of 1° C./s to 15° C./s, and the temperature is kept for 30 s to 1 min. This hydrogen baking is conventionally performed for removing a natural oxide film formed on a wafer surface due to the cleaning prior to the growth of the epitaxial layer. However, hydrogen baking under the above conditions can sufficiently recover the crystallinity of the silicon wafer 10.

Needless to say, the recovery heat treatment may be performed using a heating apparatus separate from the epitaxial apparatus after the first step prior to the second step. This recovery heat treatment may be performed at 900° C. to 1200° C. for 10 s to 1 h. Here, the baking temperature is 900° C. to 1200° C. At a temperature lower than 900° C., it is difficult to achieve the effect of recovering the crystallinity, whereas at a temperature of higher than 1200° C., slips would occur due to the high temperature heat treatment, which increases the heat load on the apparatus. Further, the heat processing time is 10 s to 1 h or less. It is difficult to achieve the effect of recovery in cases of less than 10 s, whereas the productivity is deteriorated in cases of more than 1 h, which increases the heat load on the apparatus.

Such recovery heat treatment can be performed using, for example, a rapid heating/cooling apparatus such as an RTA or an RTO, or a batch type heating apparatus (vertical type heating apparatus, horizontal type heating apparatus). The former apparatus is not suitable for long-time treatment, since it performs heating by lamp illumination, and is suitable for heat treatment for within 15 min. On the other hand, the latter can be used for simultaneously heating a multiplicity of wafers at a time, although it takes a long time to raise the temperature to a predetermined temperature. Further, the latter performs resistance heating, which can be used for long-time heat treatment. The heating apparatus to be used may be selected as appropriate in consideration of the conditions for irradiation with the cluster ions 16.

A silicon epitaxial layer can be given as an example of the epitaxial layer 20 formed on the modifying layer 18, and the silicon epitaxial layer can be formed under typical conditions. For example, a source gas such as dichlorosilane or trichlorosilane can be introduced into a chamber using hydrogen as a carrier gas, so that the source material can be epitaxially grown on the silicon wafer 10 by CVD at a temperature in the range of about 1000° C. to 1200° C., although the growth temperature varies depending on the source gas to be used. The thickness of the epitaxial layer 20 is preferably in the range of 1 μm to 15 μm. When the thickness is less than 1 μm, the resistivity of the epitaxial layer 20 would change due to outdiffusion of dopants from the silicon wafer 10, whereas a thickness exceeding 15 μm would affect the spectral sensitivity characteristics of the solid-state image sensing device. The epitaxial layer 20 is used as a device layer for producing a back-illuminated solid-state image sensing device.

Next, a silicon wafer 100 produced according to the above methods will be described. As shown in FIG. 1C, this epitaxial silicon wafer 100 includes a silicon wafer 10; a modifying layer 18 formed from a certain element in a surface portion of the silicon wafer 10; and an epitaxial layer 20 on the modifying layer 18. Here, the silicon wafer 10 is a silicon wafer free of dislocation clusters and COPs, and the full width half maximum W of the concentration profile of the certain element in the depth direction of the modifying layer 18 is 100 nm or less. Specifically, according to the method of producing an epitaxial wafer, of the present invention, the element constituting cluster ions can be precipitated at a high concentration in a localized region as compared with monomer-ion implantation, which results in the full width half maximum W of 100 nm or less. The lower limit of the full width half maximum can be set to 10 nm.

Note that "concentration profile in the depth direction" herein means a concentration distribution in the depth direction, which is measured by secondary ion mass spectrometry (SIMS). Meanwhile, "full width half maximum of the concentration profile of a certain element in the depth direction" means a full width half maximum of the concentration profile of a certain element in an epitaxial layer measured by SIMS and if the thickness of the epitaxial layer exceeds 1 μm, the epitaxial layer is previously thinned to 1 μm considering the measurement precision.

The certain element is not limited in particular as long as it is an element other than silicon. However, carbon or at least two kinds of elements containing carbon are preferable as described above.

In terms of achieving higher gettering capability, it is preferable that the peak of the concentration profile of the constituent element in the depth direction of the modifying layer 18 lies at a depth within 150 nm from the surface of the silicon wafer 10 in the epitaxial silicon wafer 100. Further, the peak concentration of the concentration profile is preferably $1 \times 10^{15}$ atoms/cm$^3$ or more, more preferably in the range of $1 \times 10^{17}$ atoms/cm$^3$ to $1 \times 10^{22}$ atoms/cm$^3$, and still more preferably in the range of $1 \times 10^{19}$ atoms/cm$^3$ to $1 \times 10^{21}$ atoms/cm$^3$.

The thickness of the modifying layer 18 in the thickness direction may be approximately in the range of 30 nm to 400 nm.

The metal contamination of the epitaxial silicon wafer 100 of the present invention can be further suppressed by achieving higher gettering capability than conventional. Moreover, since a silicon wafer free of dislocation clusters and COPs is used as a substrate, an epitaxial silicon wafer with epitaxial defects due to dislocation clusters and COPs being minimized can be obtained.

In a method of producing a solid-state image sensing device according to an embodiment of the present invention, a solid-state image sensing device is formed on the epitaxial layer 20 disposed on the surface of the epitaxial silicon wafer produced by the above method or the above described epitaxial silicon wafer, that is, the epitaxial silicon wafer 100. In solid-state image sensing devices obtained by this producing method, formation of white spot defects can be sufficiently suppressed than conventional.

Representative embodiments of the present invention have been described above. However, the present invention is not limited to those embodiments. For example, two epitaxial layers may be formed on the silicon wafer 10.

EXAMPLES

Figure 4:
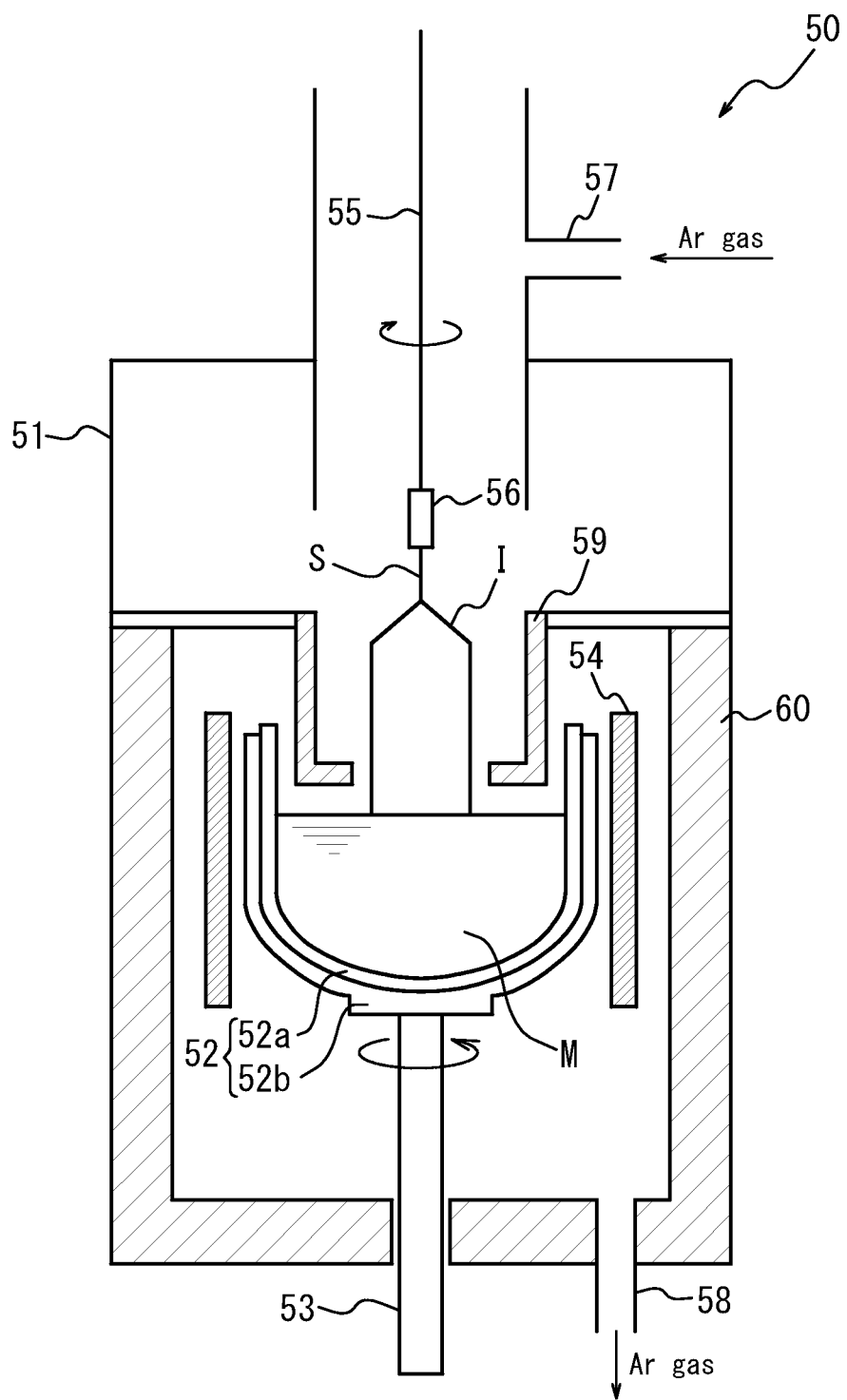
FIG. 4 is a diagram showing a single crystal production apparatus used in Examples.

FIG. 4 is a diagram schematically illustrating the structure of a single crystal production apparatus used to achieve the conditions for producing a single crystal silicon ingot which is the material for a silicon wafer free of dislocation clusters and COPs that is used as a substrate of an epitaxial silicon wafer of the present invention. As shown in this diagram, the enclosure of the single crystal production apparatus 50 is constituted by a chamber 51, and a crucible 52 is disposed in a center part of the chamber. The crucible 52 has a double layer structure composed of an inner quartz crucible 52a and an outer graphite crucible 52b, which is fixed to the tip of a crucible rotating/elevating shaft 53 capable of rotation and elevation.

A resistance heating heater 54 surrounding the crucible 52 is disposed on the outer side of the crucible 52, and a thermal insulator 60 is provided on the outer side of the resistance heating heater 54 along the inner surface of the chamber 51. A lifting shaft 55 such as a wire rotating at a predetermined speed in the same direction as or opposite to the coaxial crucible rotating/elevating shaft 53, is provided above the crucible 52. A seed crystal S is held by a seed crystal holder 56 attached to the lower end of the lifting shaft 55.

A cylindrical heat shield 59 surrounding a growing ingot I is disposed in an upper part of the crucible 52 in the chamber 51. The heat shield 59 shields the growing ingot I against high temperature radiant heat from material melt M in the crucible 52 and the side walls of the heater 54 and the crucible 52, thereby adjusting the amount of incident light and the amount of heat diffused in the vicinity of the crystal growth interface. The heat shield 59 serves to control the temperature gradient in the direction of the pulling axis at the center of the single crystal ingot and the edge of the single crystal ingot.

A gas inlet 57 for introducing an inert gas such as Ar gas into the chamber 51 is provided on an upper portion of the chamber 51. An exhaust port 58 for evacuating the chamber 51 by the action of a vacuum pump not shown is provided at a lower portion of the chamber 51. The inert gas introduced through the gas inlet 57 into the chamber 51 flows down between the growing silicon single crystal ingot I and the heat shield 59, passes through the gap between the bottom of the heat shield 59 and the liquid surface of the material melt M, flows out of the heat shield 59 and then toward the out of the crucible 52, and subsequently flows down outside the crucible 52 to be discharged from the exhaust port 58.

Using this single crystal production apparatus 50, a solid material such as polycrystalline silicon filling the inside of the crucible 52 is melted by heating with the heater 54, with the chamber 51 being kept in an Ar gas atmosphere under reduced pressure, thereby forming the material melt M. After that, the lifting shaft 55 is lowered to immerse the seed crystal S in the material melt M, and raising the lifting shaft 55 upward while rotating the crucible 52 and the lifting shaft 55 in a certain direction, thereby growing the ingot I downward from the seed crystal S.

In this example, in order to grow a single crystal ingot constituted by a denuded zone uniform in the diameter direction, a single crystal ingot I was grown as follows such that the relationship between the temperature gradient Gc of the center porion of the single crystal ingot in the pulling axis direction and the temperature gradient Ge at the edge of the single crystal ingot satisfies a condition of Gc/Ge>1 at temperatures of the growing single crystal ingot in the range of the melting point to 1300° C. The condition was satisfied by adjusting the size, shape, and the installation height of the heat shield 59, and varying the pulling speed from high speed (1.0 mm/min) to low speed (0.3 mm/min), thereby growing a straight body having a crystalline region profile varying in the length direction. The grown single crystal silicon ingot I is an n-type single crystal silicon ingot having a crystal orientation of <100> and a straight body diameter of 310 mm, doped with phosphorus ($1 \times 10^{15}$ atoms/cm$^3$ to $1 \times 10^{17}$ atoms/cm$^3$), and the oxygen concentration of the ingot I (ASTM F121-1979) is $12 \times 10^{17}$ atoms/cm$^3$ to $14 \times 10^{17}$ atoms/cm$^3$.

The distribution of defects formed in the single crystal silicon ingot grown as described above was evaluated. Specifically, first, the single crystal silicon ingot grown in the experiment of changing the pulling speed was vertically divided along the lifting shaft to prepare plate samples, and the prepared samples, were then subjected to oxygen precipitation heat treatment (nitrogen atmosphere, 800° C.×4 h+1000° C.×16 h). Subsequently, the heat-treated sample was dipped in a copper sulfate aqueous solution to be decorated with Cu, and then subjected to heat treatment in a nitrogen atmosphere at 900° C. for 20 min. After that, the distribution of defects in the surface of the sample was evaluated by X-ray topography. The schematic diagram of the obtained defect distribution is shown in FIG. 5.

Figure 5:
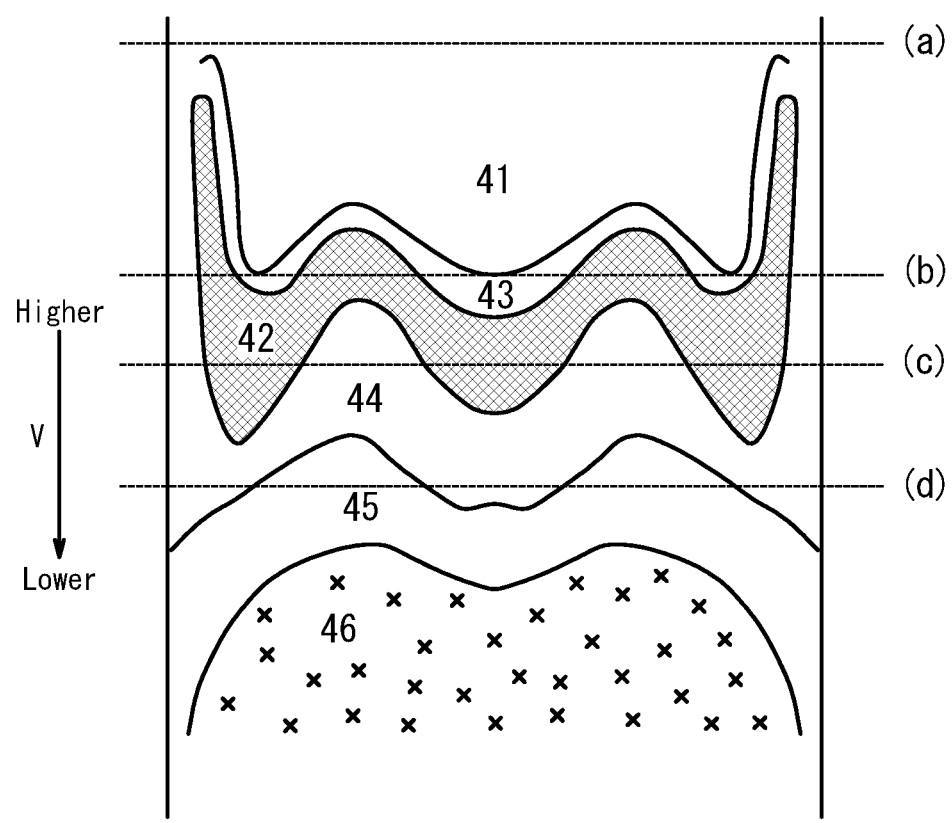
FIG. 5 is a diagram showing a defect profile on a vertical section of a single crystal silicon ingot obtained in an experiment of changing the pulling speed in Examples.

The pulling condition (pulling speed) was changed to obtain crystalline regions at the positions of lines (a) to (d) in FIG. 5. Four levels of single crystal silicon ingots (a) to (d) having crystalline regions corresponding to the respective positions of the lines (a) to (d) having different crystalline region distributions were grown. All the conditions other than the changed pulling speed are the same as the growing conditions in the experiment of changing the pulling speed.

The four levels of grown single crystal silicon ingots were subjected to process steps of known peripheral grinding, slicing, lapping, etching, and mirror polishing, thereby preparing silicon wafers having a thickness of 725 μm. Specifically, four kinds of wafers having the following crystalline regions were prepared. Whether or not dislocation clusters are contained in the prepared silicon wafers was examined by visual inspection after Secco etching; however, no dislocation clusters were found in any of the silicon wafers.

Wafer (a): COP formation region constitutes the entire surface of wafer
Wafer (b): Mixed region of OSF latent nucleus region and Pv(1) region
Wafer (c): Mixed region of OSF latent nucleus region and Pv(2) region
Wafer (d): Mixed region of Pv(2) region and Pi region Invention Example 1

Using the wafer (b) fabricated as described above, using a cluster ion generator (CLARIS produced by Nissin Ion Equipment Co., Ltd.), $C_5H_5$ clusters were generated as cluster ions, and the silicon wafer was irradiated with the cluster ions under the conditions of dose: $9.00\times10^{13}$ Clusters/cm$^2$ (carbon dose: $4.50\times10^{14}$ atoms/cm$^2$), and acceleration voltage per one carbon atom: 14.8 keV/atom. Subsequently, the silicon wafer was cleaned with HF and then transferred into a single wafer processing epitaxial growth apparatus (produced by Applied Materials, Inc.) and subjected to hydrogen baking at 1120° C. for 30 s in the apparatus. A silicon epitaxial layer (thickness: 8 μm, kind of dopant: phosphorus, dopant concentration: $1\times10^{15}$ atoms/cm$^3$) was then epitaxially grown on the silicon wafer by CVD at 1150° C. using hydrogen as a carrier gas and trichlorosilane as a source gas, thereby obtaining a silicon epitaxial wafer of the present invention.

Invention Examples 2 and 3

Epitaxial silicon wafers according to the present invention were produced in the same manner as in Invention Example 1, except that the silicon wafer as a substrate was changed to the wafer (c) (Invention Example 2) and the wafer (d) (Invention Example 3). Note that in Invention Examples 1 to 3, irradiation with cluster ions was performed at 80 keV/Cluster, and each cluster was composed of five carbon atoms (atomic weight 12) and five hydrogen atoms (atomic weight 1). Accordingly, the energy received by one carbon atom was $80\times\{12\times5/(12\times5+1\times5)\}/5\approx14.8$ keV.

Comparative Examples 1 to 3

Epitaxial silicon wafers according to Comparative Examples 1 to 3 were produced in the same manner as in Invention Examples 1 to 3 except that monomer ions of carbon were produced using $CO_2$ as a material gas and a monomer-ion implantation step was performed under the conditions of dose: $9.00\times10^{13}$ atoms/cm$^2$ and acceleration voltage: 300 keV/atom instead of the step of irradiation with cluster ions. Specifically, wafers (b) to (d) were used as substrates in Comparative Examples 1 to 3, respectively, and carbon monomer ions were implanted into the silicon wafers at an acceleration voltage of 300 keV.

Comparative Example 4

An epitaxial silicon wafer according to Comparative Example 4 was produced in the same manner as in Invention Example 1, except that the silicon wafer was changed to the wafer (a).

Comparative Example 5

An epitaxial silicon wafer according to Comparative Example 5 was produced in the same manner as in Comparative Example 1, except that the silicon wafer was changed to the wafer (a).

The samples prepared in Invention Examples and Comparative Examples above were evaluated. The evaluation methods are shown below.

(1) SIMS Measurement

Figure 6:
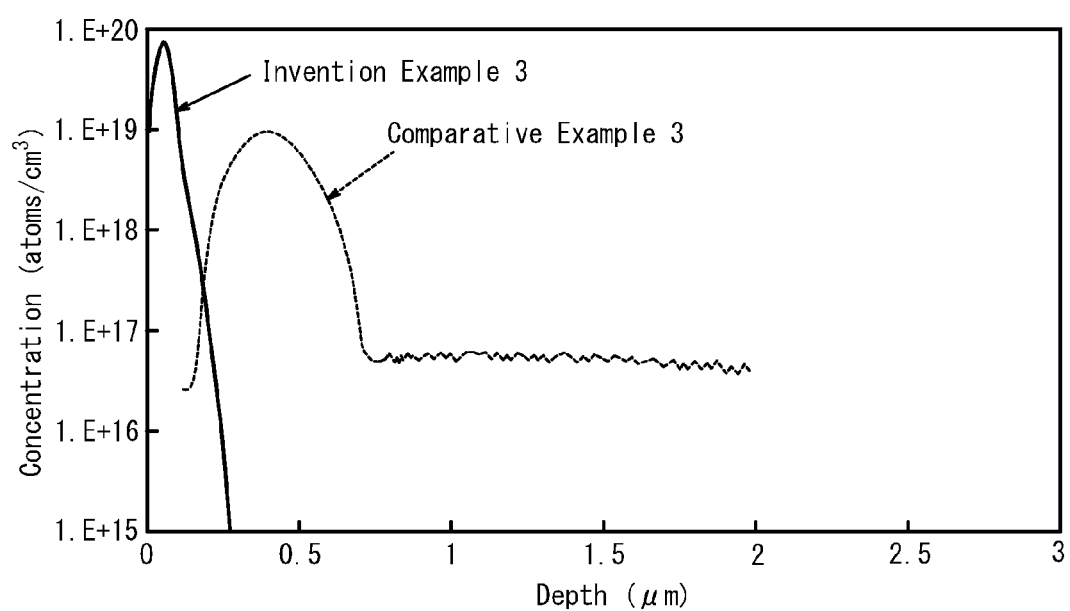
FIG. 6 is a graph showing profiles of carbon concentration with respect to the depth from the surface of a silicon wafer between Invention Example 3 and Comparative Example 3.

In order to explain the difference of carbon distribution between immediately after irradiation with cluster ions and immediately after implantation of monomer ions, first, SIMS measurement was performed on the silicon wafers of Invention Example 3 and Comparative Example 3 before forming the epitaxial layers. The obtained carbon concentration profile is shown in FIG. 6 for reference. Here, the horizontal axis in FIG. 6 corresponds to the depth from the surface of the silicon wafer.

Figure 7:
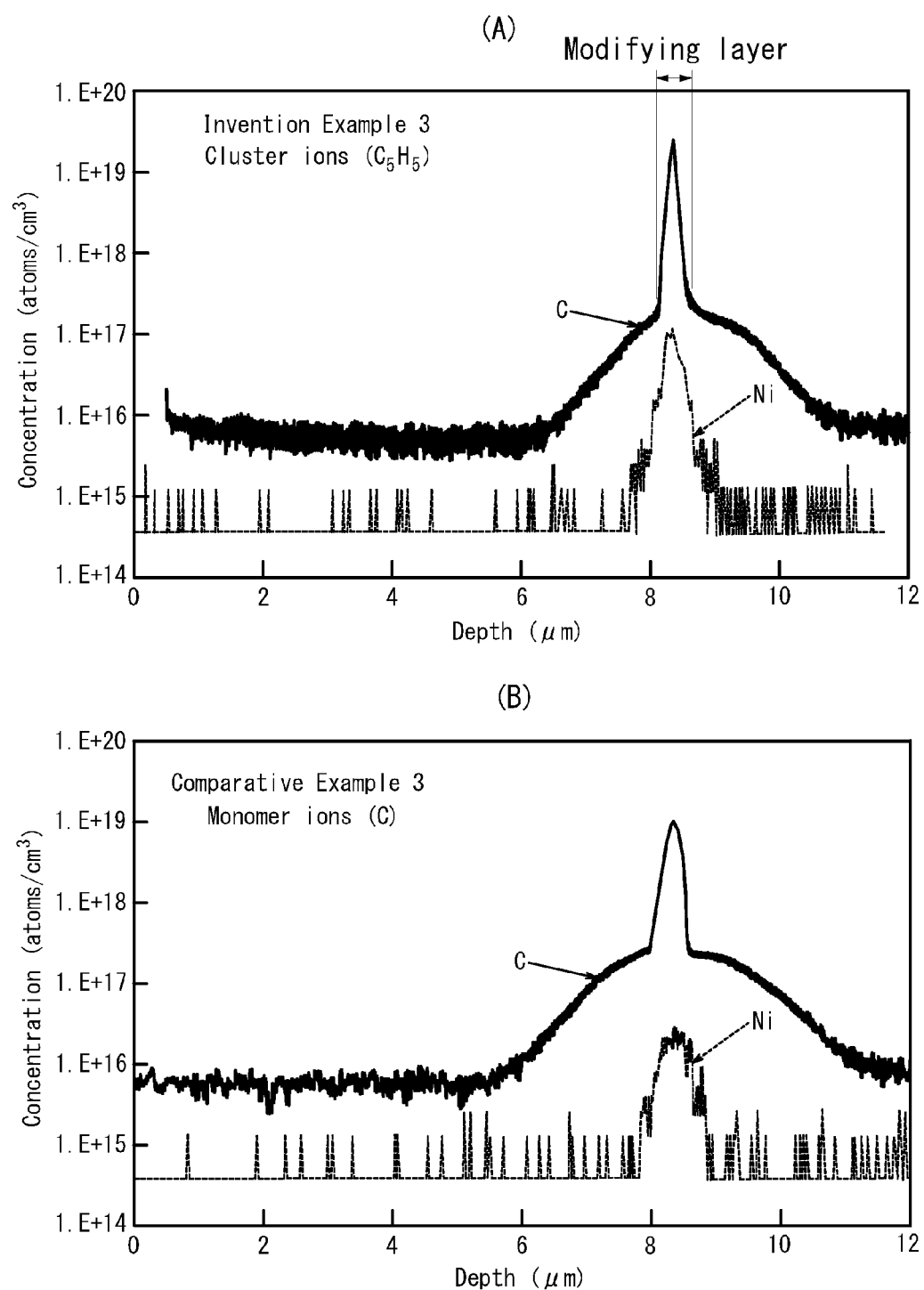
FIGS. 7A and 7B are graphs for comparing the capability of Ni gettering in Invention Example 3 and Comparative Example 3.

Next, SIMS measurement was performed on the epitaxial silicon wafers of Invention Example 3 and Comparative Example 3. The obtained carbon concentration profiles are shown in FIGS. 7A and 7B. The horizontal axis in each of FIGS. 7A and 7B corresponds to the depth from the surface of the epitaxial silicon wafer.

Further, SIMS measurement was performed on the samples prepared in Invention Examples and Comparative Examples after reducing the thickness of the epitaxial layers to 1 μm. The half widths of the measured carbon concentration profiles are shown in Table 1. Note that as described above, the half widths shown in Table 1 are half widths measured by SIMS measurement after reducing the thickness of the epitaxial layers to 1 μm, so that the half widths shown in Table 1 are different from the half widths shown in FIGS. 7A and 7B. Further, the peak position of the concentration and the peak concentration at the time of the SIMS measurement on each sample with the thinned epitaxial wafer are also shown in Table 1.

TABLE 1

| | Cluster ion irradiation conditions (Invention Example) Monomer-ion implantation conditions (Comparative Example) | | | | Evaluation result | | | | |
|---|---|---|---|---|---|---|---|---|---|
| | | | | | SIMS measurement result | | | | |
| | Irradiation/ implantation ions | Acceleration voltage (keV/atom) | Dose (Clusters/cm²) (atoms/cm²) | Wafer type | Carbon concentration peak position (nm) | Carbon peak concentration (atoms/cm³) | Half width (nm) | Gettering capability evaluation | Stacking faults (number/wafer) |
| Invention Example 1 | $C_5H_5$ | 14.8 | $9.00 \times 10^{13}$ | (b) Pv(1) + OSF | 50.1 | $3.00 \times 10^{19}$ | 70.5 | A | 0 |
| Invention Example 2 | $C_5H_5$ | 14.8 | $9.00 \times 10^{13}$ | (c) OSF + Pv(2) | 50.3 | $3.03 \times 10^{19}$ | 70.3 | A | 0 |
| Invention Example 3 | $C_5H_5$ | 14.8 | $9.00 \times 10^{13}$ | (d) Pv(2) + Pi | 50.3 | $2.98 \times 10^{19}$ | 70.4 | A | 0 |
| Comparative Example 1 | $CO_2$ | 300 | $9.00 \times 10^{13}$ | (b) Pv(1) + OSF | 380 | $9.00 \times 10^{18}$ | 245.8 | C | 0 |
| Comparative Example 2 | $CO_2$ | 300 | $9.00 \times 10^{13}$ | (c) OSF + Pv(2) | 380.2 | $9.00 \times 10^{18}$ | 245.6 | C | 0 |
| Comparative Example 3 | $CO_2$ | 300 | $9.00 \times 10^{13}$ | (d) Pv(2) + Pi | 380.1 | $9.00 \times 10^{18}$ | 245.7 | C | 0 |
| Comparative Example 4 | $C_5H_5$ | 14.8 | $9.00 \times 10^{13}$ | (a) COP | 50.2 | $3.00 \times 10^{19}$ | 70.4 | A | 2 |
| Comparative Example 5 | $CO_2$ | 300 | $9.00 \times 10^{13}$ | (a) COP | 380.1 | $9.03 \times 10^{18}$ | 246 | C | 3 |

(2) Evaluation of Gettering Capability

The silicon wafer surface of each sample fabricated in Invention Examples and Comparative Examples was contaminated on purpose by a spin coat contamination method using Ni contaminant liquid ($1.0 \times 10^{12}$ atoms/cm²) and was then subjected to heat treatment at 900° C. for 30 min. After that, a SIMS measurement was performed. The Ni concentration profiles and the carbon concentration profiles of Invention Example 3 and Comparative Example 3 are shown as representative measurement results (FIGS. 7A and 7B). Results of gettering capability evaluation with respect to other invention examples and comparative examples are shown in Table 1. Note that the criteria were classified as follows depending on the value of the peak concentration of the Ni concentration profile.

A: (Excellent) $1.0 \times 10^{17}$ atoms/cm³ or more
B: (Good) $5.0 \times 10^{16}$ atoms/cm³ or more and less than $1.0 \times 10^{17}$ atoms/cm³
C: (Fair) $1.0 \times 10^{16}$ atoms/cm³ or more and less than $5.0 \times 10^{16}$ atoms/cm³

(3) Evaluation of Epitaxial Defects

The surface of the epitaxial wafer of each of the samples fabricated in invention Examples and Comparative Examples was observed and evaluated using Surfscan SP2 manufactured by KLA-Tencor Corporation to examine the formation of LPDs. The observation was performed using an observation mode of oblique mode (oblique incidence mode), and the surface pits were examined based on the ratio of the sizes measured using wide/narrow channels. Subsequently, whether the LPDs were stacking faults (SFs) or not was evaluated using a scanning electron microscope (SEM) by observing and evaluating the area where the LPDs are formed. After that, samples for observing and evaluating cross sections including the SF formation area were fabricated by focused ion beam (FIB) processing. Finally, these evaluation samples were observed and evaluated using a transmission electron microscope (TEM), thereby evaluating whether the LPDs were SFs caused by COPs or not. The number of SFs is shown in Table 1.

First, Invention Example 3 is compared with Comparative Example 3 which is different only in that monomer ion implantation was performed instead of irradiation with cluster ions. As shown in FIG. 6, comparing the carbon concentration profiles of silicon wafers before forming an epitaxial layer, which silicon wafers are in-process products, between immediately after irradiation with cluster ions and immediately after monomer-ion implantation, the carbon concentration after the irradiation with cluster ions is sharp, whereas the carbon concentration profile after monomer-ion implantation is broad. This suggests that the tendency of the carbon concentration profile remains the same even after forming the epitaxial layer. Actually, as evident from the carbon concentration profiles of these in-process products provided with an epitaxial layer (FIGS. 7A and 7B), the irradiation with cluster ions yielded a modifying layer more locally at a higher concentration than in monomer-ion implantation. Further, comparing Invention Example 3 and Comparative Example 3 based on the Ni concentration profiles shown in FIGS. 7A and 7B, the modifying layer of Invention Example 3 formed by cluster ion irradiation is found to have captured a large amount of Ni, thus achieving high gettering capability.

Moreover, as shown in Table 1, in each of Invention Examples 1 to 3 and Comparative Example 4 in which irradiation with cluster ions was performed, the half width was 100 nm or less, and sufficient gettering capability was achieved. On the other hand, in Comparative Examples 1 to 3 and 5 in which monomer-ion implantation was performed, the half width exceeded 100 nm, so that poor gettering capability was achieved. Thus, in Invention Examples 1 to 3 and Comparative Examples 1 to 3 and 5, in which irradiation with cluster ions was performed, higher gettering capability can be achieved due to smaller half width of the carbon concentration profile than in Comparative Example 4 in which monomer-ion implantation was performed.

In each of Invention Examples 1 to 3 and Comparative Examples 1 to 3 using the wafers (b) to (d), the number of SFs was zero, whereas SFs were found in Comparative Examples 4 and 5 using the wafer (a) collected from the COP formation region. Thus, it is shown that epitaxial defects can be prevented by using the wafers (b) to (d).

Industrial Applicability

According to the present invention, an epitaxial silicon wafer which can suppress metal contamination by achieving higher gettering capability, which has minimized epitaxial defects caused by dislocation clusters and COPs, can be efficiently produced. Therefore, the present invention is useful in an industry of semiconductor epitaxial wafer production.

REFERENCE NUMERALS

100: Epitaxial silicon wafer
10: Silicon wafer
10A: Surface portion of silicon wafer
16: Cluster ions
18: Modifying layer
20: Epitaxial layer
41: COP formation region
42: OSF latent nucleus region
43: Oxygen precipitation promoted region (Pv(1) region)
44: Oxygen precipitation promoted region (Pv(2) region)
45: Oxygen precipitation inhibited region (Pi region)
46: Dislocation cluster region
50: Single crystal production apparatus
51: Chamber
52: Crucible
52a: Quartz crucible
52b: Graphite crucible
53: Crucible rotating/elevating shaft
54: Heater
55: Lifting shaft
56: Seed crystal holder
57: Gas inlet
58: Exhaust port
59: Heat shield
60: Thermal insulator
I: Single crystal silicon ingot
S: Seed crystal
M: Material melt

The invention claimed is:

1. A method of producing an epitaxial silicon wafer, comprising:
    a first step of irradiating a silicon wafer free of dislocation clusters and COPs with cluster ions to form a modifying layer formed from a constituent element of the cluster ions in a surface portion of the silicon wafer; and
    a second step of forming an epitaxial layer on the modifying layer of the silicon wafer,
    wherein, after the first step, the silicon wafer is transferred into an epitaxial growth apparatus to be subjected to the second step without heat treating the silicon wafer for recovering its crystallinity.

2. The method of producing an epitaxial silicon wafer, according to claim 1, wherein the cluster ions contain carbon as a constituent element.

3. The method of producing an epitaxial silicon wafer, according to claim 2, wherein the cluster ions contain at least two kinds of elements including carbon as constituent elements.

4. The method of producing an epitaxial silicon wafer, according to claim 1, wherein in the first step, the silicon wafer is irradiated with the cluster ions such that the peak of a concentration profile of the constituent element in the depth direction of the modifying layer lies at a depth within 150 nm from the surface of the silicon wafer.

5. The method of producing an epitaxial silicon wafer, according to claim 4, wherein the first step is performed under the conditions of acceleration voltage per one carbon atom: 50 keV/atom or less, cluster size: 100 or less, and carbon dose: $1 \times 10^{16}$ atoms/cm$^2$ or less.

6. The method of producing an epitaxial silicon wafer, according to claim 4, wherein the first step is performed under the conditions of: acceleration voltage per one carbon atom: 40 keV/atom or less, cluster size: 60 or less, and carbon dose: $5 \times 10^{15}$ atoms/cm$^2$ or less.

7. The method of producing an epitaxial silicon wafer, according to claim 1, wherein in the first step, the silicon wafer is irradiated with the cluster ions such that the full width half maximum of a concentration profile of the constituent element in the depth direction of the modifying layer is 100 nm or less.

8. A method of producing a solid-state image sensing device, wherein a solid-state image sensing device is formed on the epitaxial silicon layer, located in the surface portion of the epitaxial wafer fabricated by the producing method according to claim 1.

9. A method of producing a solid-state image sensing device, wherein a solid-state image sensing device is formed on the epitaxial silicon layer, located in the surface portion of the epitaxial silicon wafer fabricated by the producing method according to claim 1, wherein in the first step, the silicon wafer is irradiated with the cluster ions such that the full width half maximum of a concentration profile of the constituent element in the depth direction of the modifying layer is 100 nm or less.

* * * * *